United States Patent [19]
Craig et al.

[11] Patent Number: 5,438,272
[45] Date of Patent: Aug. 1, 1995

[54] VOLTAGE-STRESSING AND TESTING OF NETWORKS USING MOVING PROBES

[75] Inventors: Jeffrey A. Craig, Raleigh, N.C.; Ka-Chiu Woo, Hopewell Junction, N.Y.

[73] Assignee: International Business Machines Corporation, Armonk, N.Y.

[21] Appl. No.: 240,056

[22] Filed: May 9, 1994

[51] Int. Cl.$^6$ ............... G01R 31/08; G01R 27/02
[52] U.S. Cl. .................. 324/537; 324/519; 324/677; 324/711; 324/718
[58] Field of Search ........... 324/519, 525, 537, 548, 324/549, 676, 677, 710, 711, 718

[56] References Cited

U.S. PATENT DOCUMENTS

| | | | |
|---|---|---|---|
| 3,255,409 | 6/1966 | Sztybel | 324/60 |
| 3,296,523 | 1/1967 | Haas et al. | 324/57 |
| 3,417,323 | 12/1968 | Willimson | 324/28 |
| 4,565,966 | 1/1986 | Burr et al. | 324/73 PC |
| 5,006,808 | 4/1991 | Watts | 324/537 |
| 5,266,901 | 11/1993 | Woo | 324/537 |

*Primary Examiner*—Kenneth A. Wieder
*Assistant Examiner*—Diep Do
*Attorney, Agent, or Firm*—Richard Lau; Alison D. Mortinger

[57] ABSTRACT

A network-under-test of a device is tested relative to other networks of the device by probing the network-under-test with a probe; generating a voltage which is applied across the network-under-test via the probe for developing a transient voltage between the network-under-test and the other networks of the device for stressing leakage resistance between the network-under-test and the other networks; and determining if the stressed leakage resistance is acceptable for determining integrity of the network-under-test relative to the other networks of the device.

10 Claims, 8 Drawing Sheets

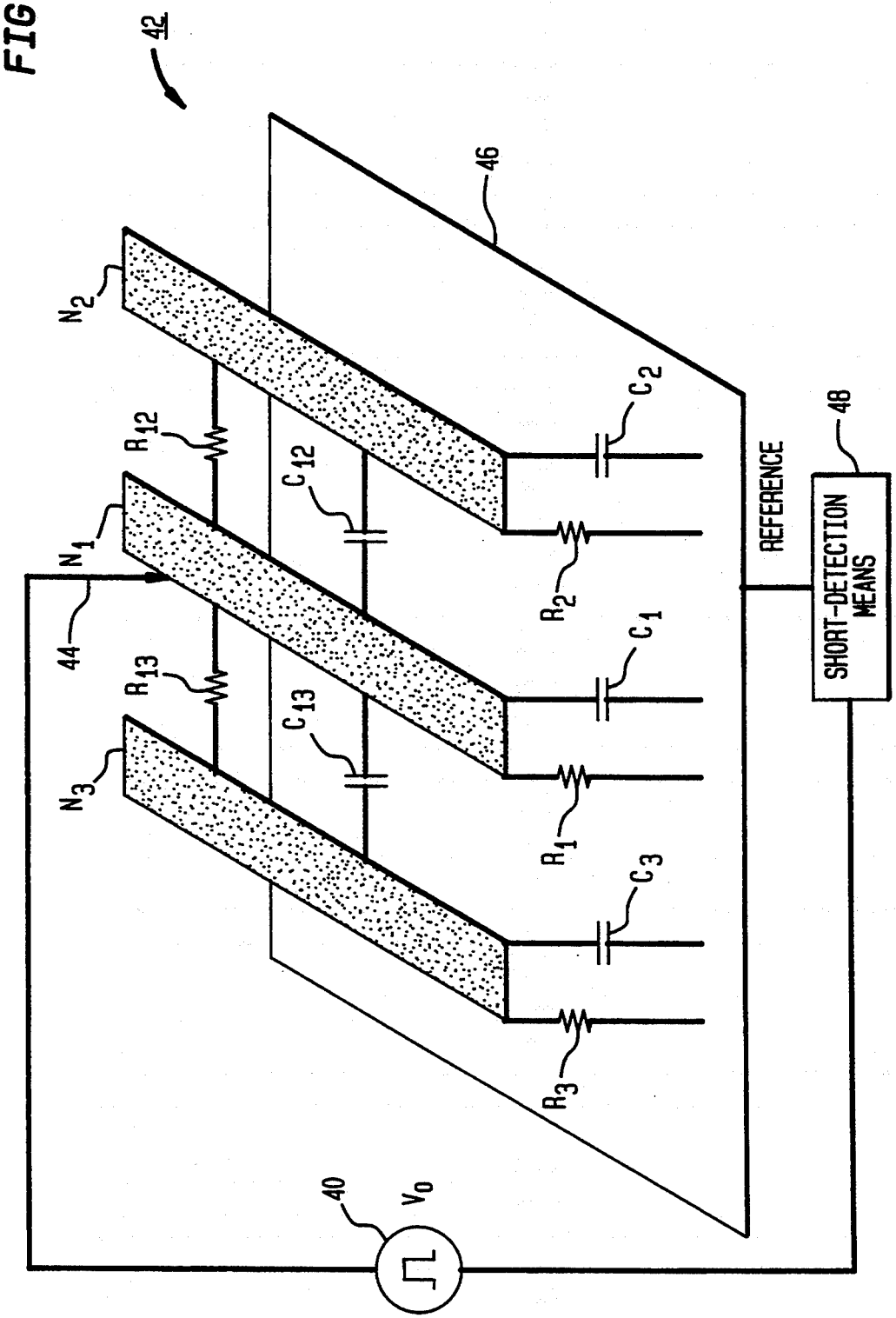

VOLTAGE-STRESSING AND TESTING OF NETWORKS USING MOVING PROBES

TECHNICAL FIELD

The present invention relates generally to high density circuit boards and ceramic substrates and, more particularly, to voltage-stressing and testing of networks within high density circuit boards and ceramic substrates using moving probes.

BACKGROUND OF THE INVENTION

In order to insure that networks ("nets") in a circuit board are not shorted together and do not have an unacceptable internet (leakage) resistance therebetween, the isolation material between one net and all of the other nets of the circuit board must be tested. Such a test, i.e., the socalled "shorts" test, typically has two criteria; first, the capability to detect an isolation resistance less than a specified threshold; and, second, the capability of voltage-stressing the isolation material between interconnects. It is also important that shorts are not destroyed by the voltage applied thereto during such stressing. In this regard, if a short is blown in an uncontrolled manner, the debris may remain inside the circuit board, and possibly redevelop into a short.

More specifically, voltage-stressing of the interconnect isolation material is necessary for the detection of latent defects. Such defects can consist of isolation material having characteristics that are voltage-dependent and/or time-dependent. An example of a latent defect is isolation material that initially passes a resistance test, but over time degrades in resistance to the point that it becomes a noticeable short. It has been found that stressing the isolation material during shorts detection can hasten the change of latent defects, thus revealing such defects during the test; whereas, a shorts measurement test lacking voltage-stressing would not cause alteration of the defective isolation material, and the defect would thus remain undetected.

As an example, consider a latent defect between nets consisting of a high leakage resistance that is voltage-dependent. Assume that short detection means is being used that, for this specific case, is capable of detecting a leakage resistance up to 10 Mohms, and that a stress voltage of 10 volts is applied across the defect and the resistance measured is large, i.e., over 10 Mohms. The net is therefore considered as good or acceptable. However, if a voltage-stress of 50 volts is then applied, the resistance measured would become small, i.e., less than 1 Kohm. The leakage resistance in this instance falls within the sensitivity of the short-detection means, and the net is thus flagged as defective.

The traditional testing method for packaging products, such as printed circuit boards and substrates, is the cluster probe, or "bed-of-nails" method. In the cluster-probe method of testing, all of the interconnects, or nets, in a packaging device are connected to the tester simultaneously, i.e., at least one probe is physically placed on each of the nets at the same time. Shorts between nets are detected by measuring the leakage current (and hence the resistance) between different nets. Ideally, this current would be very small. With this method of testing shorts, all nets but one are electrically connected. The isolation material between the one net and all of the linked nets is then tested using a resistive measurement. This method has the capability of voltage-stressing the isolation material between nets up to a voltage limit set by the test equipment and the device-under-test for as long a dwell time as desired. Cluster-type probe testing is advantageous in that very high throughput is achievable, and large volumes of products having the same pattern or footprint can be efficiently tested. The problem with the cluster-probe shorts test, therefore, is not in the measurement, but is in the fact that a unique probe head must be built to match every product. This is often cost prohibitive and requires long lead-times for designing and building the necessary equipment.

To avoid the high capital expense and long lead-time of the cluster-probe testing, an alternative method, called moving-probe testing, is used. Instead of having a fixed test probe that exactly matches the device to be tested, the moving-probe tester has probe mechanisms that can dynamically place a limited set of probes onto selected interconnects. Moving-probe testers are, therefore, able to test a wide diversity of devices, each with its own unique footprint, in a more cost-effective and timely fashion. There are tradeoffs, however, to the flexibility gained through the use of the moving-probe test method. If a moving-probe tester was to use the resistive method for shorts detection, a probe would have to be placed on the net to be tested, and another probe would have to be sequentially placed on each of the other nets. This would result in N(N-1)/2 measurements, where N is the number of nets. This test would be able to detect and locate shorts and apply a voltage-stress to the isolation material between nets, similar to the method used by the cluster-probe tester. The test would, however, become unacceptably slow as the number of nets in a device increases. Therefore, faster methods for short-detection and voltage-stressing with a moving-probe are desirable.

In order to improve the speed of the moving-probe shorts test, measurements other than a two-probe resistance test are used. These techniques make use of a single moving probe to contact the net to be tested and use a fixed probe to contact a reference plane during the measurement. The large number of measurements of the previous shorts test methods is thereby avoided since, ideally, the moving probe must contact each net only once, resulting in N total tests. Typically, the measurement used is capacitive, though this need not be the case. Conventionally, although this method of shorts detection reduces test time, it does so at the expense of measurement sensitivity and voltage-stressing capability. Prior art patents which discuss short detection using a moving probe, but addressing only the resistance criteria of shorts detection, and not discussing voltage-stressing of the net using a moving probe, include U.S. Pat. No. 4,565,966, issued Jan. 21, 1986 to Burr et al.; U.S. Pat. No. 5,006,808, issued Apr. 9, 1991 to Watts (the "Watts" patent); commonly assigned, U.S. Pat. No. 5,266,901, issued Nov. 30, 1993 to Woo (the "Woo" patent); and, commonly assigned, U.S. Ser. No. 843,672, filed on Feb. 28, 1992, Halperin et. al., pending ("Halperin et.al.").

It has been generally accepted that internet, or net-to-net, voltage-stressing cannot be accomplished with the moving probe test methodology because only one test point is contacted at a time.

Thus, there remains a need for voltage-stressing capability with single moving-probe shorts testing. Further, the voltage-stressing should terminate after an appropriate stress period for low-resistance shorts, so that such shorts do not burn out due to the voltage-stressing.

SUMMARY OF THE INVENTION

Generally, the present invention relates to the testing of a network-under-test of a device, relative to other networks of the device. A probe is used to probe the network-under-test. A voltage is generated and applied across the network-under-test via the probe for developing a transient voltage between the network-under-test and the other networks of the device for stressing leakage resistance between the network-under-test and the other networks. It is then determined if the stressed leakage resistance is acceptable for determining integrity of the network-under-test relative to the other networks of the device.

BRIEF DESCRIPTION OF THE DRAWINGS

These and other features, aspects and advantages will be more readily apparent and better understood from the following detailed description of the invention, in which:

FIG. 2A shows a device having the voltage-stressing means and testing means connected thereto in accordance with the present invention;

DETAILED DESCRIPTION OF THE PREFERRED EMBODIMENT

Generally speaking, the present invention involves applying a voltage pulse to a net-under-test such that a transient voltage is developed between the net-under-test and other nets of the device or circuit board. The voltage pulse is applied using a single moving probe, and the transient voltage stresses the leakage resistance between the net-under-test and the other nets of the device, and the stressed leakage resistance is then tested. However, as described hereinbelow, depending on the stressing parameters chosen, such stressing and testing may not be considered complete, and additional stressing and testing may be required. Such further stressing and testing is not required for the nets that are determined to be acceptable and/or have definitely failed. The additional stressing and testing is required in the case of a net which is determined to be either shorted to another net or as having a leakage resistance less than an acceptable leakage resistance. In these cases, the minimum voltage-stress time specified for the device-under-test cannot necessarily be guaranteed using a single moving probe. In this regard, the stress time for such a net may be shorter than the stress time required, and thus it would not be possible to stress the net for an adequate stress period using a single moving probe. The additional stressing and testing requires a two-probe voltage-stress means to apply the appropriate voltage-stress. The two-probe voltage-stress means is a device capable of applying a voltage across the defective isolation material or leakage resistance for the appropriate period of stress time. The appropriate period of stress time is specified in, for example, the electrical specification, of the device-under-test (DUT). The stressing and testing can thus be completed.

Figure 1A:
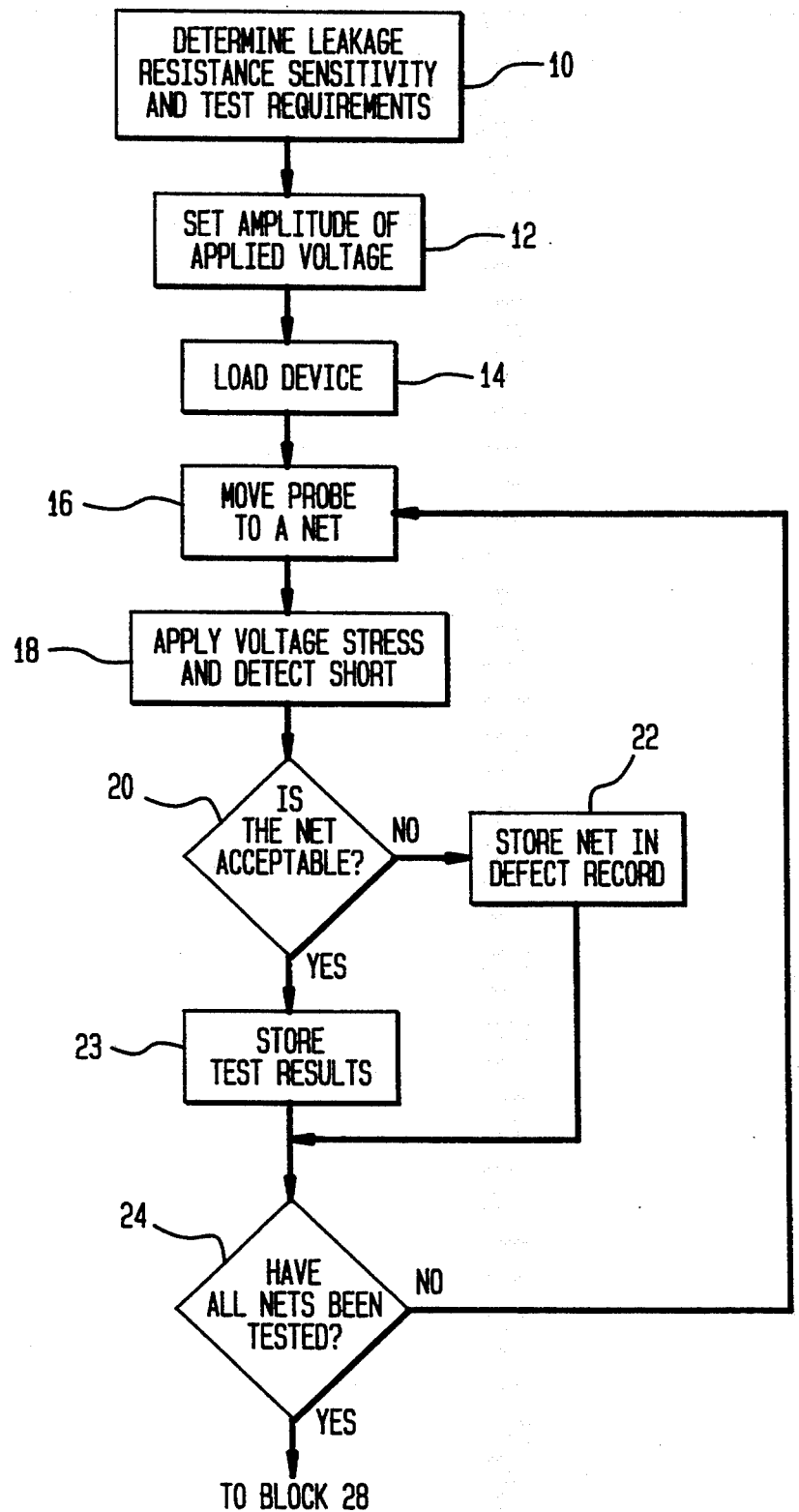
FIG. 1A is a flowchart showing testing steps in accordance with the present invention.

Referring initially to FIG. 1A, the leakage resistance sensitivity and test requirements for the device-under-test is determined at block 10. Using the determined parameters, the amplitude of an applied voltage $V_0$, which can be, for example, a voltage ramp or pulse, is set at block 12. The amplitude of the applied voltage $V_0$ is set in accordance with the minimum voltage and minimum stress time requirements for the DUT. The leakage resistance sensitivity and amplitude of the applied voltage $V_0$ are needed to ensure that the minimum dwell time requirement for the particular device-under-test is satisfied. Details of how the amplitude of the applied voltage and dwell time are determined are provided hereinbelow. At block 14, the DUT is then loaded into testing apparatus, and a moving probe is then applied at block 16 to the specific net of the DUT to be tested. At block 18, voltage $V_0$ is then applied to the net for stressing the net, and the stressed net is tested to determine if it is acceptable, or if a short or unacceptable leakage resistance between the subject net and another net of the DUT can be detected.

Referring now to FIG. 2A, the voltage $V_0$ is generated by a voltage source 40, and applied to the DUT 42 via the single moving probe 44. The voltage source 40 is connected in series with the moving probe 44, the DUT 42, a reference plane 46 and short-detection means 48. In this example, the DUT 42 comprises nets $N_1$, $N_2$ and $N_3$, and the moving probe 44 is shown as being in electrical contact with net $N_1$ for testing net $N_1$. The reference plane 46 can be a component which is internal to the DUT 42; or the reference plane 46 can be a component which is external to the DUT 42, such as a chuck upon which the DUT 42 rests. Further, the reference plane 46 can also be the ground. Each net $N_1$, $N_2$ and $N_3$ is electrically connected to the reference plane 46 through a corresponding impedance, and each such impedance is represented by a resistance and capacitance. Specifically, the impedance between the net $N_1$ and the reference plane 46 is represented by resistance $R_1$ and capacitance $C_1$, the impedance between the net $N_2$ and the reference plane 46 is represented by resistance $R_2$ and capacitance $C_2$, and the impedance between the net $N_3$ and the reference plane 46 is represented by resistance $R_3$ and capacitance $C_3$. Each net $N_1$, $N_2$ and $N_3$ is also electrically connected to each other through impedances. The impedance between net $N_1$ and net $N_2$ is represented by resistance $R_{12}$ and capacitance $C_{12}$, and the impedance between net $N_1$ and net $N_3$ is represented by resistance $R_{13}$ and capacitance $C_{13}$. More particularly, resistance $R_{12}$ represents the isolation material or leakage resistance between nets $N_1$ and $N_2$, and resistance $R_{13}$ represents the isolation material or leakage resistance between nets $N_1$ and $N_3$. Note that for clarity and simplification, the impedance between net $N_2$ and net $N_3$ is not shown.

Figure 2B:
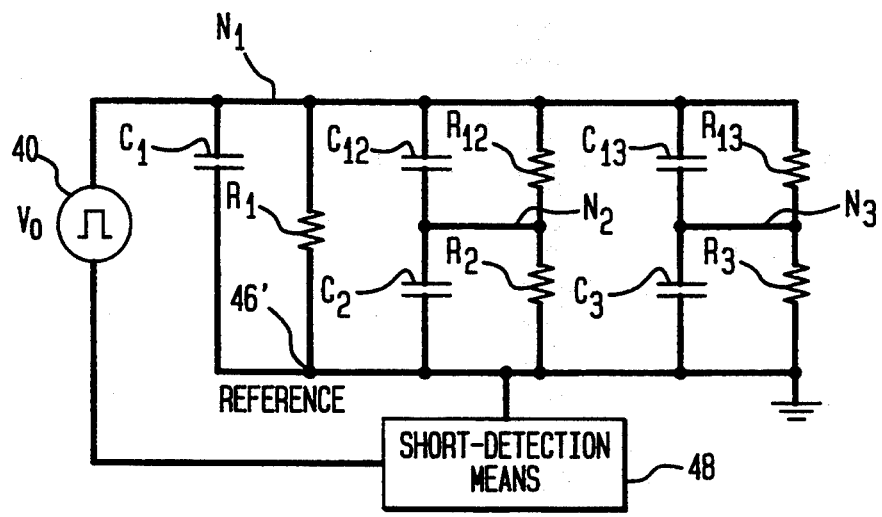
FIG. 2B shows an equivalent circuit diagram of FIG. 2A.
Figure 2C:
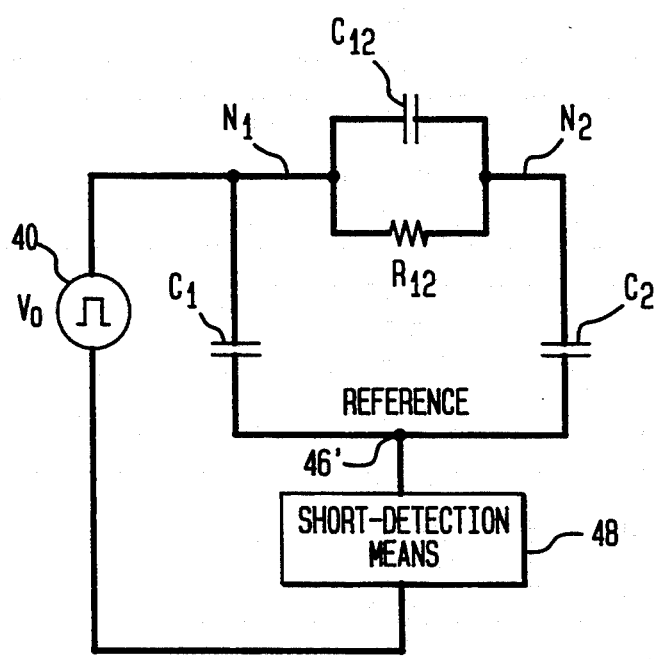
FIG. 2C shows a simplified equivalent circuit diagram of FIG. 2B.

With reference now to FIG. 2B, for purposes of clarity and simplification, a circuit diagram is illustrated which is equivalent to the circuit shown in FIG. 2A. The reference plane 46, which is represented in FIG. 2B by reference point 46', is electrically connected to nets $N_1$, $N_2$ and $N_3$ through capacitances $C_1$, $C_2$ and $C_3$ and resistances $R_1$, $R_2$ and $R_3$, respectively. By applying voltage $V_0$ to, as in this example, net $N_1$, for testing net $N_1$, resistance $R_1$, is stressed at the amplitude of voltage $V_0$ (this is true, unless, the short detection means 48 has an effect on voltage $V_0$) for the entire duration that the voltage $V_0$ is applied to the net $N_1$. The resistances $R_1$, $R_2$ and $R_3$, can be disregarded in this context, since each of these resistances can be appropriately stressed when the corresponding nets $N_1$, $N_2$ and $N_3$ are tested using the conventional voltage-stressing method of applying a voltage at two points between the isolation being tested. If an external reference is used, the stressing voltage would be reduced by the capacitive voltage divider relationship. Thus, in this specific case since nets $N_2$ and $N_3$ are in parallel with the net-under-test, net $N_1$, only one net, such as net $N_2$, as shown in FIG. 2C, needs to be considered. The remaining capacitance $C_{12}$ between net $N_1$ and net $N_2$ is typically small for packaging devices, usually much smaller than either $C_1$ or $C_2$. Unless a defect is present, the isolation or leakage resistance $R_{12}$ between net $N_1$ and net $N_2$ is typically large, and it is this isolation or leakage resistance $R_{12}$ that is voltage-stressed in accordance with the present invention.

Figure 2D:
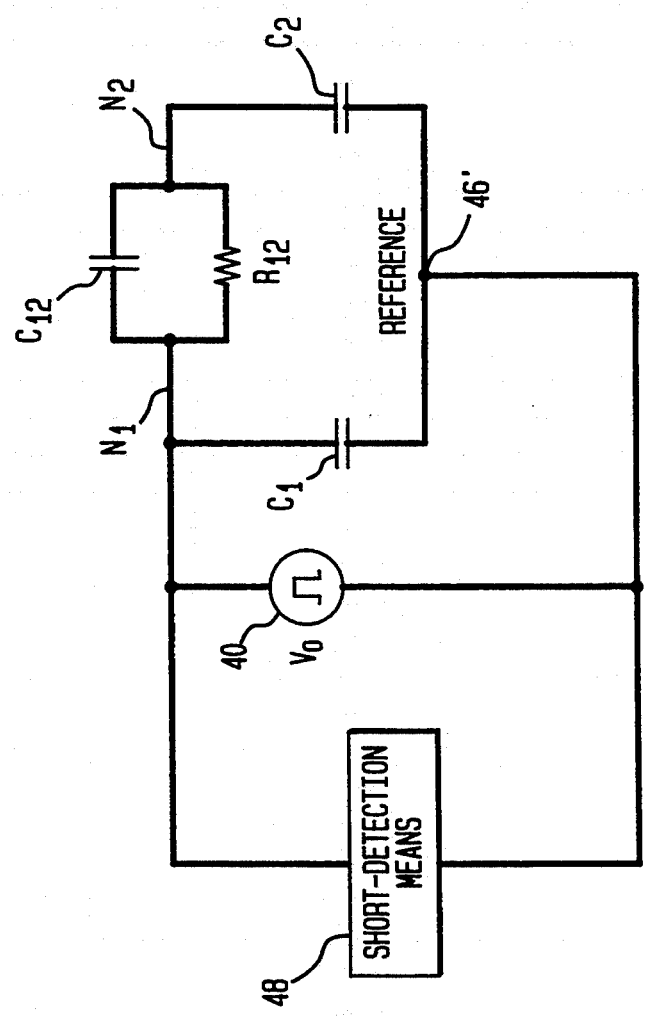
FIG. 2D shows an alternative to the circuit diagram of FIG. 2C.

Note that in FIG. 2C the short-detection means 48 is positioned in series with the voltage source 40 and the reference 46. However, in an alternate embodiment, as shown in FIG. 2D, the short-detection means 48 is positioned in parallel with the voltage source 40.

In accordance with block 18 of FIG. 1A, in order to stress the leakage resistance $R_{12}$, a voltage should be applied between net $N_1$ and net $N_2$. Ideally, such a voltage is of constant amplitude throughout an entire dwell time. This is, however, not possible since only one probe is in contact with the circuit board at a time. Particularly, the voltage $V_0$ is applied between the net $N_1$ and the reference point 46' using a single moving probe 44. Note that, in this situation, not only is the resistance $R_1$ being stressed by the voltage $V_0$, but the leakage resistance $R_{12}$ is also being stressed by a transient voltage generated by the voltage $V_0$. It is this transient voltage applied to the net $N_1$ that is being utilized in accordance with the present invention for stressing the net-to-net leakage resistance $R_{12}$. In this regard, using an ideal voltage pulse, the time dependence of the voltage across leakage resistance $R_{12}$, can be determined in accordance with Equation (1), as follows:

(1) $V_{12} = [V_0][C_2/(C_2+C_{12})][e^{-(t/R_{12}(C_2+C_{12}))}]$

Since, by the nature of typical devices, capacitance $C_{12}$ is much smaller than capacitance $C_2$, Equation (1) can be simplified to Equation (2), as follows:

(2) $V_{12} = [V_0][e^{-(t/R_{12}C_2)}]$

The minimum voltage-stress for the particular DUT will be referred to herein as minimum voltage-stress $V_m$. Since $V_{12}$ decays exponentially, the applied voltage $V_0$ has to be greater than $V_m$. The minimum voltage-stress dwell time for the particular DUT will be referred to herein as minimum dwell time $T_m$. The minimum dwell time $T_m$ is the period during which $V_{12}$ must be greater than or equal to the minimum voltage-stress $V_m$. Note from Equation (2) that as the leakage resistance $R_{12}$ increases, the time period during which $V_{12}$ is greater than the minimum voltage-stress $V_m$ also increases. An infinite resistance $R_{12}$ can be stressed for as long as the stimulus $V_0$ is applied. From this, it can be concluded that good isolation material can be stressed for significant periods, while defective isolation material (low resistance) can only be stressed for relatively short periods.

Factors upon which the stress period depends include the amplitude of the applied voltage $V_0$, the period of time the stimulus is applied, the specification for the minimum voltage-stress $V_m$, and the device parameters, i.e., resistance $R_{12}$ and capacitance $C_2$. The stimulus is the factor that is controlled by voltage-stressing in accordance with the present invention. The minimum voltage-stress $V_m$ and the minimum dwell time $T_m$ are both typically specified in the electrical specification of the device-under-test. The device parameters, resistance $R_{12}$ and capacitance $C_2$, are unknown and indeterminable at the beginning of the testing. The maximum applied voltage depends on the electric breakdown voltage and other phenomena that could cause damage to the circuit board, as well as the capability of the tester in handling high voltage. The voltage-stressing must therefore be adaptable for meeting the stress requirements of amplitude and time for a range of parameters which are characteristic to the particular device-under-test, stress means, and shorts detection means.

The parameters that are used to determine the applied voltage-stress $V_0$ at block 12 are the minimum voltage-stress $V_m$, the minimum dwell time $T_m$, the resistance sensitivity $R_m$, which is the maximum leakage resistance detectable by the short-detection means 48; and the capacitance $C_2$, which is the capacitance between the leakage resistance being stressed and the reference. The value determined for applied voltage-stress $V_0$ is based on the worse case analysis for dwell time. The worse case for the dwell time is the case when the capacitance between the leakage resistance being stressed and the reference is the smallest capacitance net in the DUT (i.e., the smallest $C_2$). The applied voltage-stress can be determined as follows:

(3) $V_0 = kV_m = (\text{inverse ln } (T_m/(R_m C_2))) V_m$

Equation (3) yields a value for applied voltage-stress that meets the minimum voltage-stress $V_m$ for a period of time which is equal to the minimum dwell time $T_m$ for the worse case capacitance $C_2$ in the DUT. If the value determined for the applied voltage-stress $V_0$ exceeds the value for maximum applied voltage, then the shorts detection means 68 is incapable of meeting the voltage-stress specification for the particular DUT. The shorts detection means 68 must be capable of detecting shorts within the minimum dwell time $T_m$ and must be capable of operating while the voltage-stress is applied to the device-under-test 42.

In view of Equation (3), the dwell time for a particular instance of voltage-stress is determined by Equation (4), as follows:

(4) $t_s = (R_{12}C_2) \ln(V_0/V_m) = (R_{12}/R_m) T_m$

The dwell time $t_s$ is the time period during which the transient voltage $V_{12}$ is greater than or equal to the minimum stress voltage $V_m$. The value of the applied voltage stress $V_0$ determined at block 12 guarantees that for nets determined by the shorts detection means 68 to be acceptable, the stress time $t_s$ is greater than or equal to the minimum stress time $T_m$. A preferable moving probe testing apparatus capable of such short-detection is disclosed in the Woo patent, cited hereinabove, and incorporated herein by reference. As disclosed in the Woo patent, in order to test the integrity of a network, such as continuity, as it relates to other networks on the circuit board, a rectangular stimulus pulse is applied to the network via the moving probe. A signal in response to the stimulus pulse, provided across an external capacitor and resistor connected to the reference plane of the circuit board, is then sampled by a transient analyzer. The leading edge of the sampled response signal provides an indication of whether the network is acceptable, opened, shorted, or has a high or low leakage resistance relative to another network.

Another example of a moving probe testing apparatus capable of short-detection for the present invention is disclosed in the Watts patent, cited hereinabove. In accordance with the Watts patent, a constant current or semiconstant current is applied and the rise-time is measured and compared to the rise-time of a good net. Another example of short detection means is disclosed in Halperin, et al. cited hereinabove. In accordance with Halperin, et al., a constant alternating voltage (or alternating current) is connected in series with the network-under-test, and the impedance of the network-under-test is determined by measuring the resulting alternating current (or alternating voltage). Shorts are determined by comparing the measured impedance values to reference impedance values.

Referring again to FIG. 2C, the voltage source 40 used to apply the stress should be set to generate a voltage $V_0$ having an amplitude determined by Equation (3) at block 12. With this setting, the stress voltage $V_{12}$ will be equal to or greater than $V_m$ for a period equal to or greater than the dwell time $T_m$.

As an example of a realistic voltage-stress value, consider a ceramic packaging device. In this example, the minimum voltage-stress is specified to be 100 volts and the minimum dwell time is specified to be 100 microseconds. Assume that for the packaging device in this example, capacitance $C_2$ is in the range of 1 pF to 100 pF. Furthermore, assume that the maximum leakage resistance, $R_{12}$ detectable as a short by the shorts detection means 48 is 100 Mohms. Using Equation (3), the minimum applied voltage-stress $V_0$ would therefore be $eV_m$, or 271.8 volts.

With reference again to FIG. 1A, if a defect is detected at block 18 and the net is determined as being unacceptable at block 20, then the net is stored in a Defect Record at block 22. Note that a defect detected at this instance is defined to be a detectable leakage (short) within the resistance sensitivity $R_m$ of the short detection means, and not the resistance threshold for a short as may be specified by the electrical specification of the particular DUT. For example, if the sensitivity of detection is 1 Gohm and the electrical specification is 100 Mohm (and, for example, 100 volts), two nets with leakage resistance of 750 Mohm will be considered as a defect. This definition of defect is used at this stage to ensure that the voltage-stress and stress time requirements are also met.

If a defect is not detected at block 18 and the net is determined as being acceptable at block 20, then the relevant test results are stored at block 23. Subsequent to storing the relevant test results of an acceptable net at block 23 or storing of the results of a defective net at block 22, it is then determined at block 24 if all nets have been tested.

In situations when only a one-point-probe tester is available (i.e., a two-point-probe tester is unavailable), or when it is undesireable to use a two-probe resistive tester, voltage-stressing can be considered to have been performed satisfactorily using the one-point-probe tester only by selecting appropriate stressing parameters as provided in Equation (1) for controlling the criteria for successful voltage-stressing. These parameters include applied voltage, leakage resistance and detection threshold. In such situations, the stressing and testing can thus be considered complete when it is determined at block 24 that all nets have been tested. However, although such stressing and testing may be acceptable in some situations, such stressing and testing does have certain limitations, for example, requiring the use of higher voltage, reducing the capacitance range that can be tested, etc. In situations when these limitations to the stressing and testing are considered unacceptable, additional stressing and testing can be implemented in accordance with FIG. 1B.

Figure 1B:
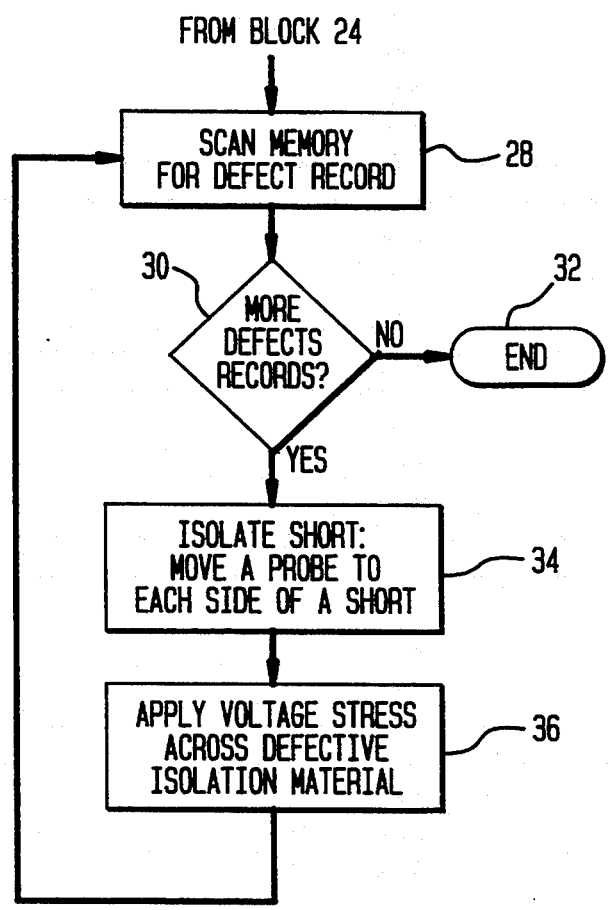
FIG. 1B is a flowchart showing additional testing steps in accordance with the present invention.

With reference now to FIG. 1B, at block 28, a net from the Defect Record at block 22 of FIG. 1A is accessed. At block 30, if it is determined that no nets are contained in the Defect Record, i.e., either all nets in the Defect Record have already been accessed and tested or no nets were found to be unacceptable, then the procedure ends at block 32. If the Defect Record contains a net that has not yet been accessed and tested, then, at block 34, the short is isolated by moving a probe to each side of the short. In other words, from the Defect Record at block 22 and/or test results at block 23, a list of nets that are suspected to be at the other end of the short is generated. At block 36, the required voltage-stress is then applied to the suspected nets. More specifically, the two-probe voltage-stress short-detection means applies a voltage across the suspected defective isolation material of the nets and the short detection means 48 determines whether the two nets are shorted in accordance with the definition provided in the electrical specification. This two-probe voltage-stress short-detection is similar to the cluster probe or bed-of-nails method, except that only two test points are connected. However, advantageously, the present invention requires that only nets suspected to be defective are probed for stressing and testing with the two-probe voltage-stress short-detection means, whereas, as discussed in the Background of the Invention, the bed-of-nails method requires that all nets be simultaneously probed for stressing and testing. The two-probe voltage-stress means used can be any conventional two-probe resistive tester. The voltage can be supplied by a voltage source, and the short is determined by measuring the leakage current by conventional current measuring means such as an ammeter or an electrometer.

At block 36, the required voltage-stress is then applied to the defective net. More specifically, the two-probe voltage-stress means applies a voltage across the defective isolation material of the net. The voltage-stress should be applied across the defective isolation material of the net for an appropriate period of stress time, as specified in, for example, the electrical specification, of the DUT.

Figure 3:
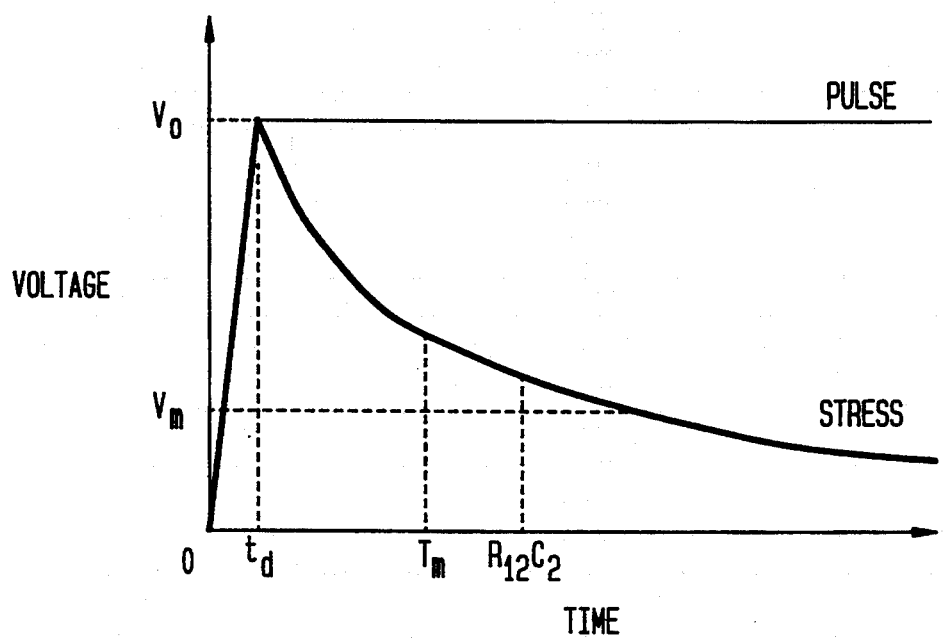
FIG. 3 is a plot showing the time dependence of voltage-stress for an acceptable network.

The time dependence of the voltage-stress for an acceptable net is shown in the plot in FIG. 3.

Although it is necessary to stress the isolation material between nets during testing, it is undesireable to burn out low-resistance defects that might be present. The reasons for this are as follows: a blown short can result in defect debris being left in the device, and possibly create a defect at a later time; after a defect is blown it cannot be detected and located; and, diagnostic studies cannot be performed on defects that no longer exist. For these reasons, it is desirable to terminate the voltage-stress for a low-resistance short condition before the defect burns out.

Voltage-stress can be limited by current limiting the voltage source or pulse generator. Another way of achieving the same goal is to use the rise-time of the applied voltage ramp or voltage pulse to cut-off the stress on a low-resistance short. As an example, consider a "dead short" defect, where the leakage resistance $R_{12}$ between nets is 1 ohm. For example, assume that the net-under-test is shorted to another net having a capacitance $C_2$ of 50 pF. From Equation (2), it is apparent that the time constant, $R_{12}C_2$, is a very short time period, 50 ps. This time period is shorter than the rise-time of most voltage pulses and ramps. As such, the voltage-stress decays to a low level before the applied voltage reaches peak amplitude. In order to determine the leakage resistance $R_{cut-off}$ that results in a time constant equal to or less than the pulse rise-time $t_d$, Equation (5) can be utilized.

(5) $R_{cut-off} = t_d/C_2$

Figure 4:
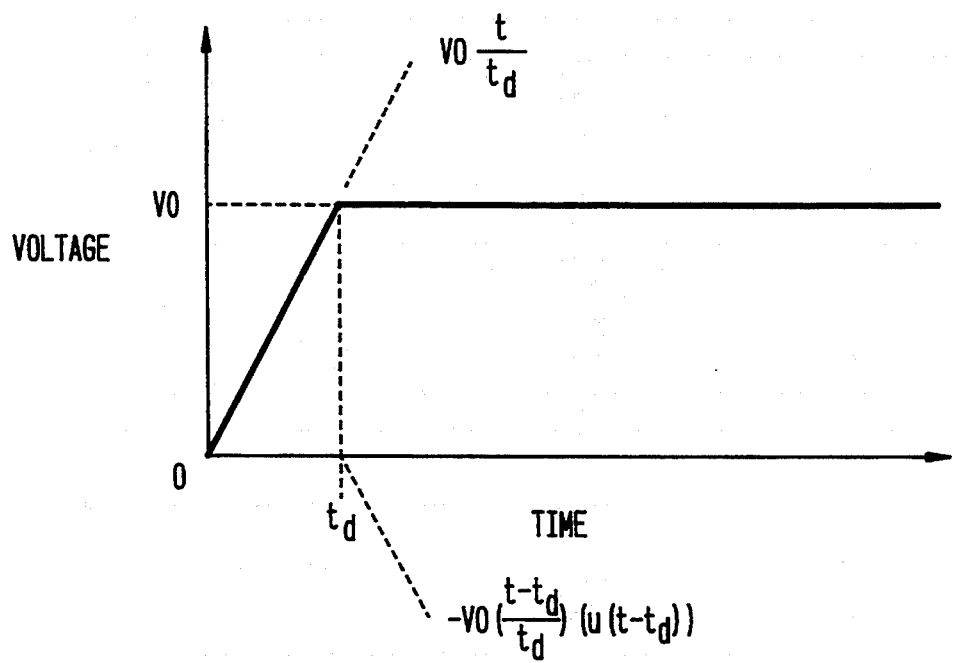
FIG. 4 is a plot showing a voltage pulse consisting of a linear ramp for a time $t_d$.

The concept of voltage-stress cut-off can be illustrated in another manner. Consider a voltage pulse consisting of a linear ramp for a time, $t_d$, and a constant voltage after time $t_d$. The time vs. voltage plot of such a pulse is illustrated in FIG. 4. The pulse can be represented mathematically by Equation (6), as follow:

(6) $V(t) = [V_0][t/t_d] - [V_0][t - t_d)/t_d][u(t - t_d)]$ where $u(t-t_d)$ is a Heaviside unit function, which is a step function of unit amplitude and begins at $t=t_d$.

The voltage, $V_{12}$, across the leakage resistance, $R_{12}$, can then be represented by Equation (7), as follows:

(7) $V_{12} = [V_0][R_{12}C_2/t_d][(1 - 3^{-(t/R_{12}(C_2+C_{12}))}) - (1 - e^{-((t-td)/R_{12}(C_2+C_{12}))})(u(t-t_d))]$

Figure 5:
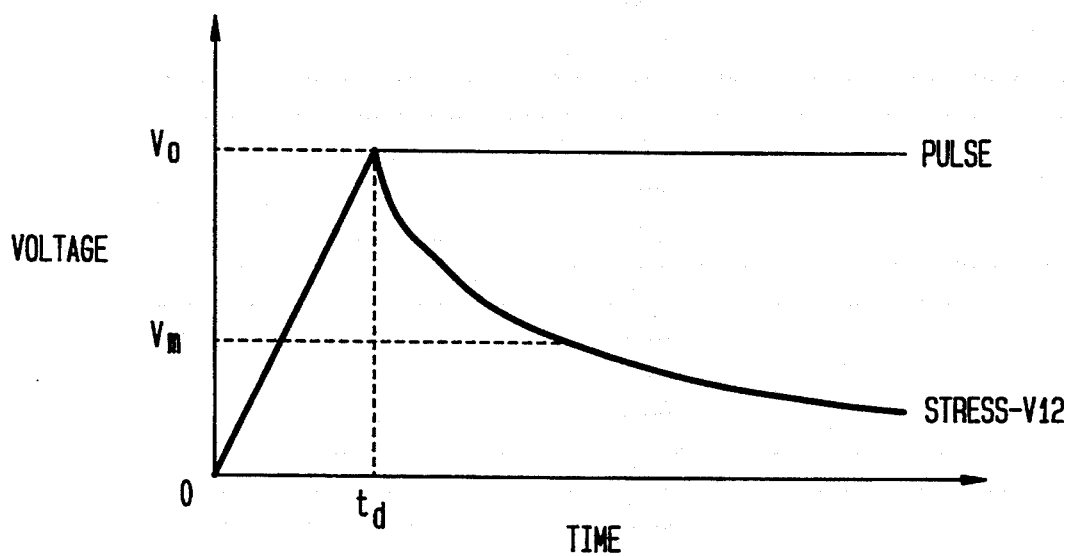
FIG. 5 is a plot showing time dependence of the voltage-stress for a large leakage resistance.

Using Equation (7), consider two different cases for defective leakage resistance $R_{12}$, as follows:

Case 1: Large Leakage Resistance, $R_{12}$—rise-time of pulse $<<$ time constant, $R_{12}C_2$. The time dependence of the voltage-stress for this case is shown in FIG. 5.

(i) $t \rightarrow 0$ (time is at the onset of the applied voltage)

(8) $V_{12}(t) = [V_0][C_2/(C_2+C_{12})][t/t_d] \sim [V_0][t/t_d]$

The voltage-stress across $R_{12}$ has the same time dependence as the pulse rise.

(ii) $t < t_d << R_{12}C_2$ (time is during the rise of the applied voltage)

$V_{12}(t) = ]V_0][C_2/(C_2+C_{12})][t/t_d] \sim [V_0][t/t_d$

The time dependence is the same as the last region—the voltage-stress across $R_{12}$ has the same time dependence as the pulse rise.

(iii) $t_d < t << R_{12}C_2$ (time is during peak amplitude of applied voltage)

(9) $V_{12} = ]V_0][e^{-((t-td)/R_{12}(C_2+C_{12}))}]$

The voltage-stress has a time dependence very similar to that of an ideal pulse, one with an instantaneous rise.

Figure 6:
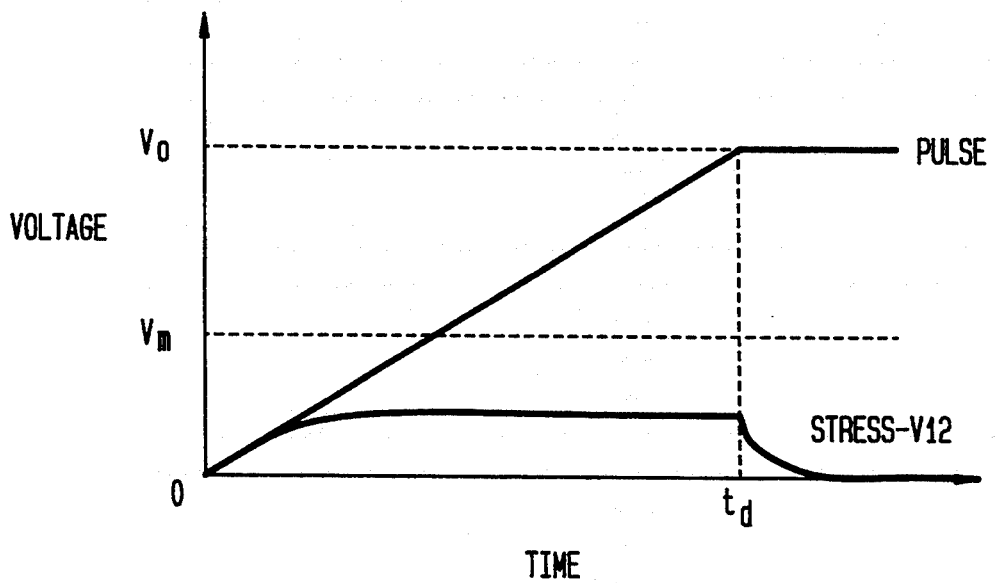
FIG. 6 is a plot showing time dependence of the voltage-stress for low leakage resistance.

Case 2: Low Leakage Resistance, $R_{12}$—rise-time of pulse, $t_d >>$ time constant, $R_{12}C_2$. The time dependence of the voltage-stress for this case is depicted in FIG. 6.

(i) $t \rightarrow 0$ (time is the onset of applied voltage)

(10) $V_{12}(t) = ]V_0][t/t_d]$

The voltage-stress across $R_{12}$ has the same time dependence as the pulse rise.

(ii) $R_{12}C_2 < t << t_d$ (time is during the rise of the applied voltage)

(11) $V_{12}(t) = [V_0][R_{12}C_2/t_d]$

This indicates that during this pulse region the voltage-stress across the isolation material is much less for a low-resistance defect.

(iii) $R_{12}C_2 << t_d < t$ (time is during peak amplitude of the applied voltage).

(12) $V_{12}(t) = [(V_0)(R_{12}C_2t_d)][e^{-((t-td)/R_{12}C_2)}]$

This indicates the decay region of the voltage-stress, and shows a starting amplitude much lower than that of the case of a high-leakage resistance.

The above calculations indicate that the voltage-stress applied to the isolation material of a low-resistance defect is much smaller in amplitude than that applied to a non-defective net or high-resistance defect. Therefore, the rise-time of the applied voltage can be used to set the threshold resistance for voltage-stress cut-off.

Figure 7:
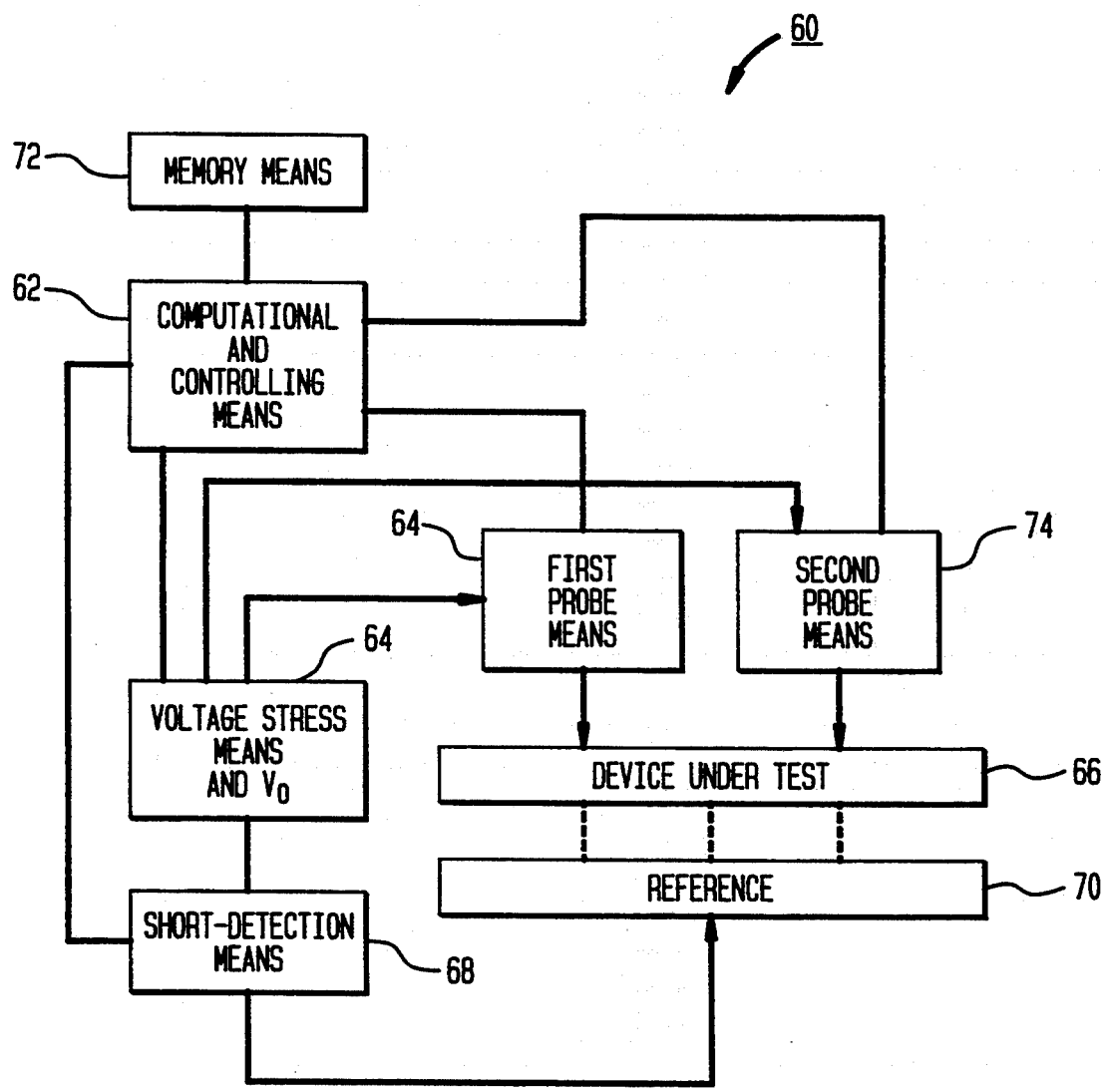
FIG. 7 shows voltage-stress and test apparatus in accordance with the present invention.

Referring to FIG. 7, voltage-stress and test apparatus 60 in accordance with the present invention is shown. The computational and controlling means 62 directs the first probe 64 to the net-under-test of the DUT 66, and the voltage-stress means 64 delivers a voltage $V_0$ to the net-under-test via the first probe 64. The short-detection means 68 is connected to the reference 70, and detects if a short exists between the net-under-test and another net of the DUT 66. If such a short exists, the net-under-test is considered to be defective, and is stored in memory means 72; and if such a short does not exist, then the net-under-test is considered to be good or acceptable. The computational and controlling means 62 then directs the first probe 64 to the next net to be tested, and this continues until all nets of the DUT are tested.

Each defective net stored in the memory means 72 is then successively accessed by the computational and controlling means 62. For each defective net accessed, the computational and controlling means 62 directs the first probe 64 and a second probe 74 to each side of the potential defect, and the voltage-stress means 64 applies a voltage $V_0$ to the potential defect via the first probe 64 and second probe 74 for the necessary time period, and the defective net is thus additionally stressed and tested by detection means 68.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for testing a network-under-test of a device, relative to other networks of the device, comprising the steps of:
   (a) probing said network-under-test with a probe;
   (b) generating a voltage;
   (c) applying said voltage across said network-under-test via said probe for developing a transient voltage between said network-under-test and said other networks of said device for stressing leakage resistance between said network-under-test and said other networks; and
   (d) applying a current to said network-under-test, measuring rise-time of said voltage applied across said network-under-test, and comparing the measured rise-time to a reference rise-time for determining integrity of said network-under-test relative to said other networks of said device.

2. A method for testing a network-under-test of a device, relative to other networks of the device, comprising the steps of:
   (a) probing said network-under-test with a probe;
   (b) generating a voltage;
   (c) applying said voltage across said network-under-test via said probe for developing a transient voltage between said network-under-test and said other networks of said device for stressing leakage resistance between said network-under-test and said other networks;
   (d) determining if the stressed leakage resistance is acceptable for determining integrity of said network-under-test relative to said other networks;
   (e) if it is determined in step (d) that said stressed leakage resistance is not acceptable, then further testing said network-under-test by
   (1) probing said network-under-test with a first probe and successively probing each other network of said device with a second probe,
   (2) applying a voltage, via said first and second probes, to the isolation resistance between said network-under-test and each other network of said device as each other network is successively probed by said second probe for successively stressing the leakage resistance between said network-under-test and each other network, and
   (3) determining if the leakage resistance between said network-under-test and each other network is acceptable as each leakage resistance is successively stressed for determining integrity of said network-under-test relative to each other network.

3. An apparatus for testing a network-under-test of a device, relative to other networks of the device, comprising:
   voltage generator means for generating a voltage;
   probe means for probing said network-under-test for applying said voltage to said network-under-test for developing a transient voltage between said network-under-test and said other networks of said device for stressing leakage resistance between said network-under-test and said other networks; and
   a current source connected in series with said network-under-test, means for measuring rise-time across said network-under-test, and means for comparing the measured rise-time to a reference rise-time for determining integrity of said network-under-test relative to said other networks of said device.

4. An apparatus for testing a network-under-test of a device, relative to other networks of the device, comprising:
   voltage generator means for generating a voltage;
   probe means for probing said network-under-test for applying said voltage to said network-under-test for developing a transient voltage between said network-under-test and said other networks of said device for stressing leakage resistance between said network-under-test and said other networks;
   analyzer means for determining if the stressed leakage resistance is acceptable for determining integrity of said network-under-test relative to said other networks, and
   additional testing means implemented when said stressed leakage resistance is not acceptable, including
   (1) means for probing said network-under-test with a first probe and successively probing each other network of said device with a second probe,
   (2) means for applying a voltage, via said first and second probes, to the isolation resistance between said network-under-test and each other network of said device as each other network is successively probed by said second probe for successively stressing the leakage resistance between said network-under-test and each other network, and
   (3) means for determining if the leakage resistance between said network-under-test and each other network is acceptable as each leakage resistance is successively stressed for determining integrity of said network-under-test relative to each other network.

5. An apparatus for testing a network-under-test of a device relative to other networks of the device, comprising:
   voltage generator means for generating a voltage;
   probe means for probing said network-under-test for applying said voltage to said network-under-test for developing a transient voltage between said network-under-test and said other networks of said device for stressing leakage resistance between said network-under-test and said other networks;
   analyzer means for determining if the stressed leakage resistance is acceptable for determining integrity of said network-under-test relative to said other networks; and limiting means for limiting the voltage applied to said network-under-test for limiting the stressing of said leakage resistance.

6. An apparatus according to claim 5, wherein said limiting means comprises current limiting means.

7. An apparatus according to claim 5, wherein said limiting means utilizes the rise-time of said voltage.

8. A method for testing a network-under-test of a device, relative to other networks of the device, comprising the steps of:
(a) probing said network-under-test with a probe;
(b) generating a voltage;
(c) applying said voltage across said network-under-test via said probe for developing a transient voltage between said network-under-test and said other networks of said device for stressing leakage resistance between said network-under-test and said other networks;
(d) determining if the stressed leakage resistance is acceptable for determining integrity of said network-under-test relative to said other networks; and
(e) limiting the voltage applied to said network-under-test for limiting the stressing of said leakage resistance.

9. A method according to claim 8, wherein said voltage applied to said network-under-test is current limited for limiting the stressing of said leakage resistance.

10. A method according to claim 8, wherein said voltage applied to said network-under-test is limited in accordance with the rise-time of said voltage for limiting the stressing of said leakage resistance.

* * * * *